United States Patent
Jeon et al.

(10) Patent No.: US 8,759,815 B2
(45) Date of Patent: Jun. 24, 2014

(54) NITRIDE BASED SEMICONDUCTOR LIGHT EMITTING DEVICE

(75) Inventors: Seong Ran Jeon, Gwangju-si (KR); Young Ho Song, Jeonju-si (KR); Jae Bum Kim, Gwangju-si (KR); Young Woo Kim, Gwangju-si (KR); Woo Young Cheon, Gwangju-si (KR); Jin Hong Kim, Gwangju-si (KR)

(73) Assignee: Korea Photonics Technology Institute, Gwangju (KR)

( * ) Notice: Subject to any disclaimer, the term of this patent is extended or adjusted under 35 U.S.C. 154(b) by 0 days.

(21) Appl. No.: 13/818,572

(22) PCT Filed: Sep. 1, 2011

(86) PCT No.: PCT/KR2011/006506
§ 371 (c)(1),
(2), (4) Date: Feb. 22, 2013

(87) PCT Pub. No.: WO2012/046955
PCT Pub. Date: Apr. 12, 2012

(65) Prior Publication Data
US 2013/0299775 A1 Nov. 14, 2013

(30) Foreign Application Priority Data

Oct. 4, 2010 (KR) .................. 10-2010-0096356

(51) Int. Cl.
*H01L 33/04* (2010.01)
(52) U.S. Cl.
USPC ............. 257/14; 257/13; 257/15; 257/98; 257/99; 257/100
(58) Field of Classification Search
USPC ............. 257/98–100, 13, 14, 15
See application file for complete search history.

(56) References Cited

U.S. PATENT DOCUMENTS

2008/0237570 A1 * 10/2008 Choi et al. ............. 257/13

FOREIGN PATENT DOCUMENTS

| JP | 2003234545 | 8/2003 |
| KR | 100649749 | 11/2006 |
| KR | 1020070098031 | 10/2007 |
| KR | 1020080033666 | 4/2008 |
| KR | 1020100049451 | 5/2010 |

OTHER PUBLICATIONS

International Search Report mailed Apr. 19, 2012 for PCT/KR2011/006506, citing the above reference(s).

* cited by examiner

*Primary Examiner* — Samuel Gebremariam
(74) *Attorney, Agent, or Firm* — Lowe Hauptman & Ham, LLP

(57) ABSTRACT

The disclosure relates to a nitride based semiconductor light emitting device with improved luminescence efficiency by increasing a recombination rate of electrons and holes contributing to luminescence, which results from matching the spatial distribution of electron and hole wave functions. The nitride based semiconductor light emitting device according to the present invention includes an n-type nitride layer, an active layer formed on the n-type nitride layer, and a p-type nitride layer formed on the active layer. At this stage, a strain control layer, and the at least one layer has a larger energy bandgap than a quantum well layer in the active layer. The strain control layer is disposed in an area where the quantum well layer of the active layer is formed. Moreover, an energy bandgap of the strain control layer is less than that of quantum barrier of the active layer.

5 Claims, 3 Drawing Sheets

NITRIDE BASED SEMICONDUCTOR LIGHT EMITTING DEVICE

TECHNICAL FIELD

The present invention relates to a nitride based semiconductor light emitting device and, more particularly, to a nitride based semiconductor light emitting device in which at least one strain control layer having an energy band gap greater than that of a quantum well layer of an active layer is formed in the quantum well layer in order to enhance the luminous efficiency by reducing an internal electric field.

BACKGROUND ART

Normally a nitride based semiconductor light emitting device has a stack structure of a buffer layer, an n-type semiconductor layer, an active layer, a p-type semiconductor layer and an electrode on a substrate. The active layer is a region where electrons and holes are recombined, and has a structure that a quantum well layer is disposed between quantum barrier layers. Depending on kinds of material forming the active layer, the emitting wavelength of the nitride based semiconductor light emitting device is determined.

A single quantum well (SQW) structure having a single quantum well layer, a multi quantum well (MQW) structure having a plurality of quantum well layers, and a superlattice (SL) structure are known as the active layer. Among them, the active layer of a multi quantum well structure has been positively used since having excellent luminous efficiency per current and higher emitting output in comparison with a single quantum well structure.

Basically the luminous efficiency of such a nitride based semiconductor light emitting device depends on a recombination probability, i.e., internal quantum efficiency, of electrons and holes involved in a light-emitting process within the active layer. In order to enhance such internal quantum efficiency, a way of improving the structure of the active layer itself and a way of increasing the number of electrons and holes involved in a light-emitting process have been mainly studied.

A nitride based semiconductor light emitting device (also referred to as an ultraviolet light emitting device) that emits ultraviolet light with emitting wavelength of 365 nm or less has significantly poor luminous efficiency in comparison with other nitride based semiconductor light emitting devices having other wavelength. This results from the active layer having an AlGaN thin layer that contains high-concentration Al composition. Unfortunately, in an AlGaN/AlGaInN multi quantum well structure used as a light-emitting layer, a bending of energy band is caused by a difference in lattice constant between the quantum barrier layer of AlGaN and the quantum well layer of AlGaInN. This invites a disagreement between a spatial distribution of a wave function of electrons formed in the conduction band and a spatial distribution of a wave function of holes formed in the valance band. Therefore, the number of electrons and holes involved in a light-emitting process is reduced, and the luminous efficiency of the ultraviolet light emitting device is deteriorated.

DETAILED DESCRIPTION OF THE INVENTION

Technical Problems

Accordingly, an object of the present invention is to provide a nitride based semiconductor light emitting device having an active layer structure for enhancing the luminous efficiency thereof.

Another object of the present invention is to provide a nitride based semiconductor light emitting device having an active layer structure for suppressing a decrease in electrons and holes involved in a light-emitting process due to a spatial disagreement between wave functions of electron and hole.

Still another object of the present invention is to provide a nitride based semiconductor light emitting device having an active layer structure for increasing a recombination rate of electrons and holes involved in a light-emitting process by an agreement on spatial distribution between wave functions of electron and hole.

Technical Solutions

In order to accomplish the above objects, the present invention provides a nitride based semiconductor light emitting device that comprises an n-type nitride layer, an active layer formed on the n-type nitride layer, a p-type nitride layer formed on the active layer, and a strain control layer formed in the active layer and including at least one layer having an energy band gap greater than an energy band gap of a quantum well layer of the active layer.

In the nitride based semiconductor light emitting device of this invention, the strain control layer is interposed in a region where the quantum well layer of the active layer is formed.

In the nitride based semiconductor light emitting device of this invention, the energy band gap of the strain control layer is smaller than an energy band gap of a quantum barrier layer of the active layer.

In the nitride based semiconductor light emitting device of this invention, the strain band gap is formed as a plurality of layers in the active layer, and the plurality of layers may have the same of different energy band gaps.

In the nitride based semiconductor light emitting device of this invention, each of the active layer and the strain control layer is formed of material represented as $Al_xIn_yGa_{1-x-y}N$ ($0 \leq x \leq 1$, $0 \leq y \leq 1$).

In the nitride based semiconductor light emitting device of this invention, in the strain control layer, the aluminum content of a layer having an energy band gap greater than the energy band gap of the quantum well layer of the active layer is greater than the aluminum content of the quantum well layer of the active layer.

In the nitride based semiconductor light emitting device of this invention, in the strain control layer, the aluminum content of the layer having an energy band gap greater than the energy band gap of the quantum well layer of the active layer is smaller than the aluminum content of a quantum barrier layer of the active layer.

Advantageous Effects

According to a structure of the present invention, by forming, in the quantum well layer of the active layer, the strain control layer including at least one layer having an energy band gap greater than that of the quantum well layer, the luminous efficiency of the nitride based semiconductor light emitting device can be enhanced. Namely, by interposing the strain control layer in the quantum well layer of the active layer, the internal electric field is reduced due to a decreased difference in latter constant between the quantum well layer and the quantum barrier layer. This result in an agreement on spatial distribution between wave functions of electron and hole, thus increasing a recombination probability of electrons and holes involved in a light-emitting process. As a result, a recombination rate of electrons and holes involved in a light-emitting process is increased, and the luminous efficiency of the nitride based semiconductor light emitting device is enhanced.

MODE FOR CARRYING OUT THE INVENTION

The following descriptions are provided to assist in a comprehensive understanding of an embodiment of the present invention. Well known techniques, elements, structures, and processes will be omitted to avoid obscuring the subject matter of the present invention.

Particular terms may be defined to describe the invention in the best manner. Accordingly, the meaning of specific terms or words used in the specification and the claims should not be limited to the literal or commonly employed sense, but should be construed in accordance with the spirit of the invention as described herein. The description of the various embodiments is to be construed as exemplary only and does not describe every possible instance of the invention. Therefore, it should be understood that various changes may be made and equivalents may be substituted for various elements of the invention.

Hereinafter, an embodiment of the present invention will be described in detail with reference to the accompanying drawings.

Figure 1:
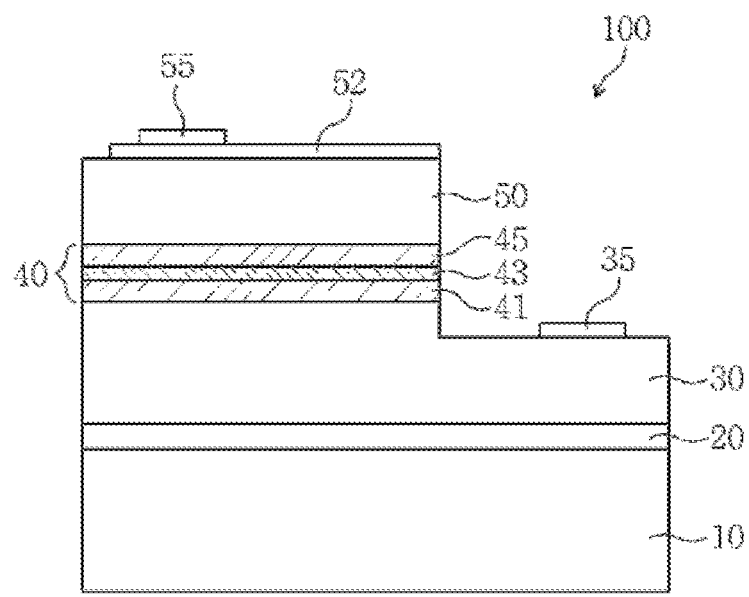
FIG. 1 is a cross-sectional view illustrating a nitride based semiconductor light emitting device having an active layer with an interposed strain control layer in accordance with the first embodiment of the present invention.
Figure 2:
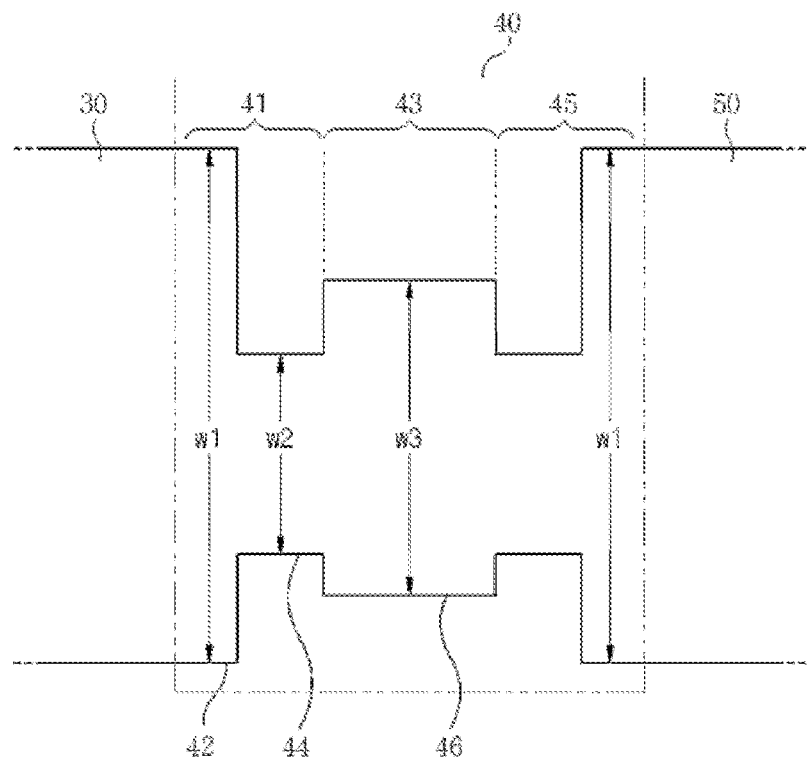
FIG. 2 is a diagram illustrating an energy band gap of a nitride based semiconductor light emitting device having an active layer with an interposed strain control layer in accordance with the first embodiment of the present invention.

FIG. 1 is a cross-sectional view that illustrates a nitride based semiconductor light emitting device 100 having an active layer 40 with an interposed strain control layer 43 in accordance with the first embodiment of the present invention. FIG. 2 is a diagram that illustrates an energy band gap of the nitride based semiconductor light emitting device 100 having the active layer 40 with the interposed strain control layer 43 in accordance with the first embodiment of the present invention. Meanwhile, the nitride based semiconductor light emitting device 100 shown in FIG. 1 is exemplary only and not to be considered as a limitation of the present invention.

Referring to FIGS. 1 and 2, the nitride based semiconductor light emitting device 100 in the first embodiment of this invention includes an n-type nitride layer 30, the active layer 40 in which the strain control layer 43 is interposed, and a p-type nitride layer 50, and may further include a base substrate 10, a buffer layer 20, an n-type electrode 35, a transparent electrode layer 52, and a p-type electrode 55.

The nitride based semiconductor light emitting device 100 in the first embodiment includes the base substrate 10 and also includes the buffer layer 20, the n-type nitride layer 30, the active layer 40 having the strain control layer 43 interposed therein, and the p-type nitride layer 50, which are formed sequentially on the base substrate 10. In the nitride based semiconductor light emitting device 100, both the p-type nitride layer 50 and the active layer 40 are partially removed by means of a mesa etching process, so that the top surface of the n-type nitride layer 30 is partially exposed. On the exposed n-type nitride layer 30, the n-type electrode 35 is formed. Additionally, the transparent electrode 52 composed of ITO (Indium-Tin Oxide) and the like is formed on the p-type nitride layer 50, and the p-type electrode 55 is formed thereon.

The base substrate 10 may be formed of material suitable for growing nitride semiconductor single crystal. For example, the base station 10 may be formed of element or compound selected from sapphire, silicon (Si), zinc oxide (ZnO), gallium nitride (GaN), gallium arsenic (GaAs), silicon carbide (SiC), aluminum nitride (AlN), magnesium oxide (MgO), and the like.

The buffer layer 20 is used for reducing a difference in lattice constant between the base substrate 10 and the n-type nitride layer 30, and may be formed of material such as GaN, AlN, AlGaN, AlInN, InGaN, AlGaInN, and the like. The buffer layer 20 performs a function to relieve stress between the base substrate 10 and the n-type nitride layer 30, such as preventing a melt-back etching caused by chemical reactions of the base substrate 10, and specifically may be formed as a multi-buffer layer such as AlInN/GaN structure, $In_xGa_{1-x}N$/GaN structure, $Al_xIn_yGa_{1-x-y}N/In_xGa_{1-x}N$/GaN, and the like ($0 \leq x \leq 1$, $0 \leq y \leq 1$). Meanwhile, this buffer layer 20 may be omitted according to device characteristics and process conditions.

The n-type nitride layer 30 is formed on the buffer layer 20. The n-type nitride layer 30 is formed of GaN series and may be doped with silicon in order to lower a driving voltage.

The active layer 40 is formed on the n-type nitride layer 30. The active layer 40 may be formed as multiple layers and may be formed as a quantum well structure by using MOCVD (Metal Organic Chemical Vapor Deposition) process. Light may emit from the active layer 40 by a combination of holes flowing through the p-type nitride layer 50 and electrons flowing through the n-type nitride layer 30. The energy of this light corresponds to a difference in energy band gaps or an excitation level of a quantum well.

Particularly, in the first embodiment, the active layer 40 includes the first active layer 41 formed on the n-type nitride layer 30, the strain control layer 43 formed on the first active layer 41, and the second active layer 45 formed on the strain control layer 43. In this case, the strain control layer 43 performs a function to relieve stress caused by a difference in lattice constant between a quantum barrier layer 42 and a quantum well layer 44 of the active layer 40, and thus suppressing a phenomenon that a wave function of electrons and a wave function of holes are in disagreement on a spatial distribution within the quantum well layer 44 of the active layer 40. The active layer 40 including the stain control layer 43 may be formed of material represented as $Al_xIn_yGa_{1-x-y}N$ ($0 \leq x \leq 1$, $0 \leq y \leq 1$). The nitride based semiconductor light emitting device 100 in the first embodiment may emit ultraviolet light with emitting wave length of 365 nm or less by regulating the thickness of the active layer 40 and composition ratio of indium.

The p-type nitride layer 50 is formed on the active layer 40. The p-type nitride layer 50 is a semiconductor layer in which p-type conductive impurity such as Mg, Zn, Be, etc. is doped. The p-type nitride layer 50 may be composed of a p-type AlGa(In)N layer which performs a role of an electron blocking layer (EBL) adjacent to a light-emitting region, and a p-type (Al)Ga(In)N layer adjacent to the p-type AlGa(In)N layer.

The transparent electrode layer 52 is formed on the p-type nitride layer 50. The transparent electrode layer 52 is a kind of electrode contact layer and allows the electric current to be properly delivered to the p-type electrode 55. The transparent electrode layer 52 may be formed of permeable oxide such as ITO, ZnO, RuOx, TiOx, IrOx, and the like.

Once a basic stack structure from the base substrate 10 to the transparent electrode layer 52 is completed, a wet etching, e.g., an anisotropic wet etching, is carried out from the surface in order to expose a part of the n-type nitride layer 30. After this etching process, the n-type electrode 35 formed of titanium (Ti), silver (Au), etc. is deposited on the n-type nitride layer 30, and the p-type electrode 55 formed of nickel (Ni), etc. is deposited on the transparent electrode layer 52.

Particularly, in the first embodiment, the active layer 40 of the nitride based semiconductor light emitting device 100 has a structure in which quantum barrier layers 42 are formed at both sides of the quantum well layer 44. The strain control layer 43 is interposed as a single layer in the active layer 40. The strain control layer 43 is disposed in the inside of the active layer 40 and has an energy band gap (w3) greater than an energy band gap (w2) of the quantum well layer 44 and smaller than an energy band gap (w1) of the quantum barrier layer 42.

Figure 3:
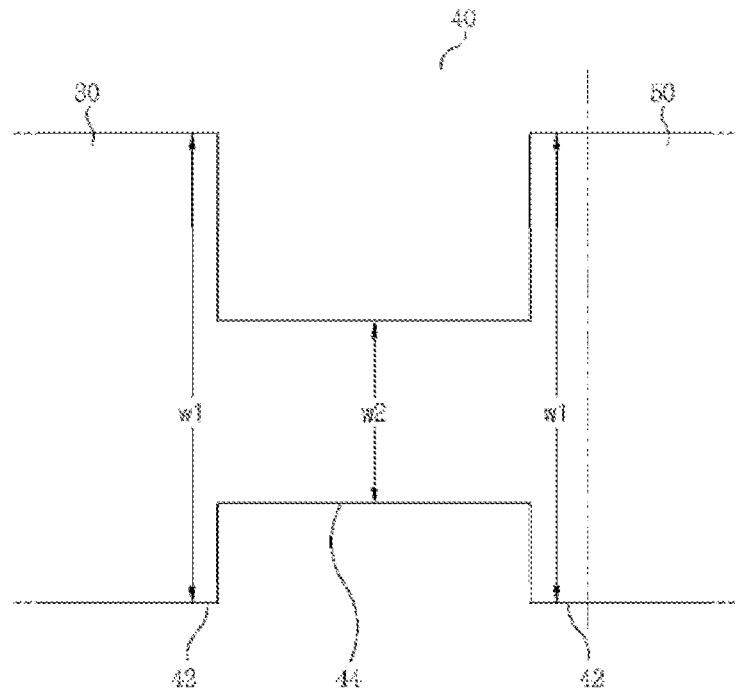
FIG. 3 is a diagram illustrating an energy band gap of a conventional nitride based semiconductor light emitting device.

The reason for forming the strain control layer 43 having an energy band gap (w3) greater than an energy band gap (w2) of the quantum well layer 44 in the quantum well layer 44 is as follows. For device applications, the nitride based semiconductor light emitting device 100 requires the increase of luminous efficiency by means of recombination of electrons and holes in the active layer 40. However, in a conventional ultraviolet light emitting device as shown in FIG. 3, the quantum well layer 44 and the quantum barrier layer 42, both of which are formed of $Al_xIn_yGa_{1-x-y}N$ and used as the active layer, produce an internal electric field due to a difference in lattice constant. Unfortunately, this causes a bending of energy band gap and a lowering of luminous efficiency. Further, this causes a disagreement on a spatial distribution between a wave function of electrons and a wave function of holes.

On the contrary, in case of the first embodiment, the strain control layer 43 which is a nitride based semiconductor layer capable of relieving strain is interposed within the quantum well layer 44. Since the strain control layer 43 formed in the quantum well layer 44 has an energy band gap (w3) greater than an energy band gap (w2) of the quantum well layer 44, the luminous efficiency of the nitride based semiconductor light emitting device 100 can be enhanced. Namely, by interposing the strain control layer 43 in the quantum well layer 44 of the active layer 40, a difference in latter constant between the quantum well layer 44 and the quantum barrier layer 42 is reduced. This results in an agreement on spatial distribution between a wave function of electrons and a wave function of holes, thereby increasing a recombination rate of electrons and holes which contribute to a light-emitting process. Here, a wave function is a function that indicates a variation in an energy band of the quantum well layer 44 with respect to the width of the quantum well layer 44. In the quantum well layer 44, a wave function of electrons and a wave function of holes are separately present. The strain control layer 43 may allow spatial distributions of both wave functions to agree with each other.

Energy band gaps of the first active layer 41, the second active layer 45 and the strain control layer 43 may be regulated by controlling their aluminum content. In order to make an energy band gap (w3) of the strain control layer 43 be greater than an energy band gap (w2) of the quantum well layer 44, the aluminum content of the strain control layer 43 is greater than that of the quantum well layer 44 of the active layer 40 and is smaller than that of the quantum barrier layer 42 of the active layer 40. Namely, the aluminum content of the strain control layer 43 is between that of the quantum well layer 44 and that of the quantum barrier layer 42.

Figure 5:
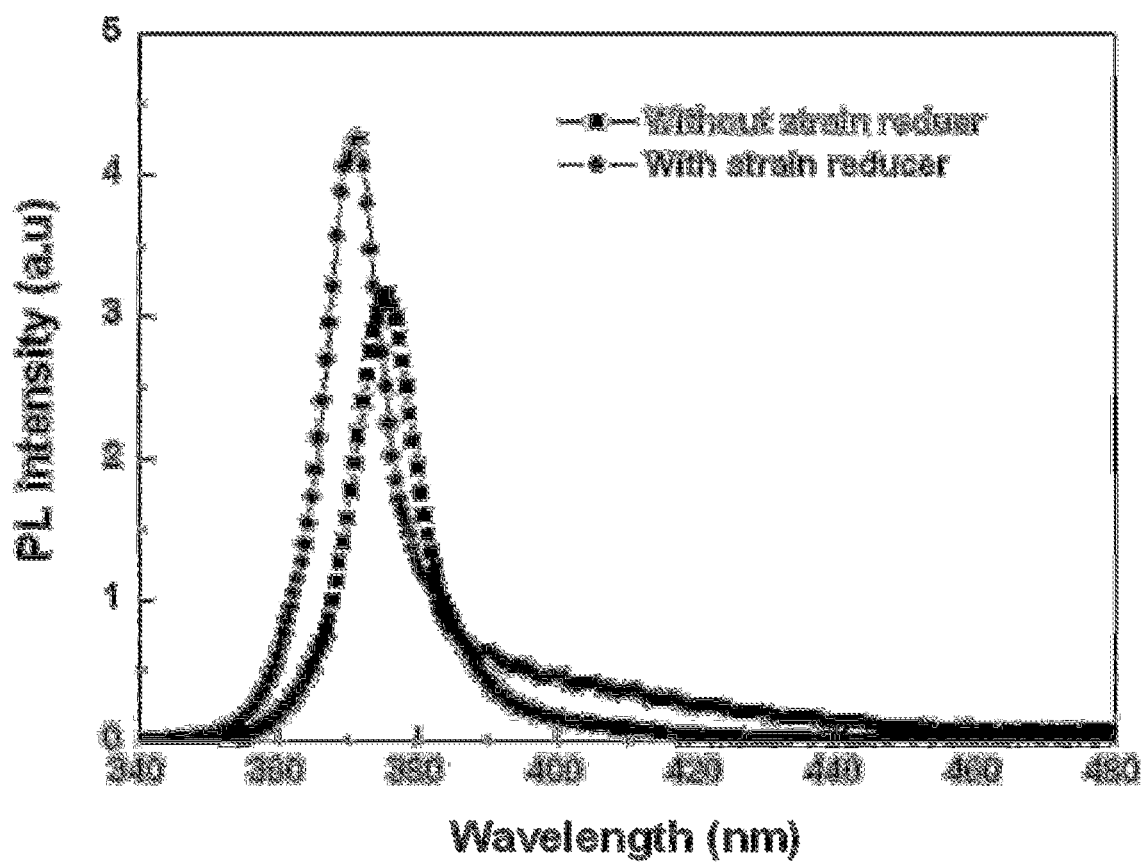
FIG. 5 is a PL (photoluminescence) spectrum, measured at room temperature, of a nitride based semiconductor light emitting device having an active layer with an interposed strain control layer in accordance with the first embodiment of the present invention.

FIG. 5 is a PL (photoluminescence) spectrum, measured at room temperature (300K), of a nitride based semiconductor light emitting device having an active layer with an interposed strain control layer in accordance with the first embodiment of the present invention.

Referring to FIG. 5, it is shown that PL spectrum intensity of the active layer with the strain control layer is higher about 30 percent than without the strain control layer. Additionally, the reason that PL spectrum wavelength of the active layer with the strain control layer is shorter is that the thickness of the active layer with the strain control layer is thinner. This was confirmed through XRD measurement. Therefore, the insertion of the strain control layer is more effective for ultraviolet light emitting devices using nitride based semiconductor.

$2^{nd}$ Embodiment

Although the nitride based semiconductor light emitting device 100 in the first embodiment uses a single-layered strain control layer 43 as shown in FIG. 2, this is exemplary only and not to be considered as a limitation. Alternatively, as shown in FIG. 4, a strain control layer 140 may be formed as multiple layers.

Figure 4:
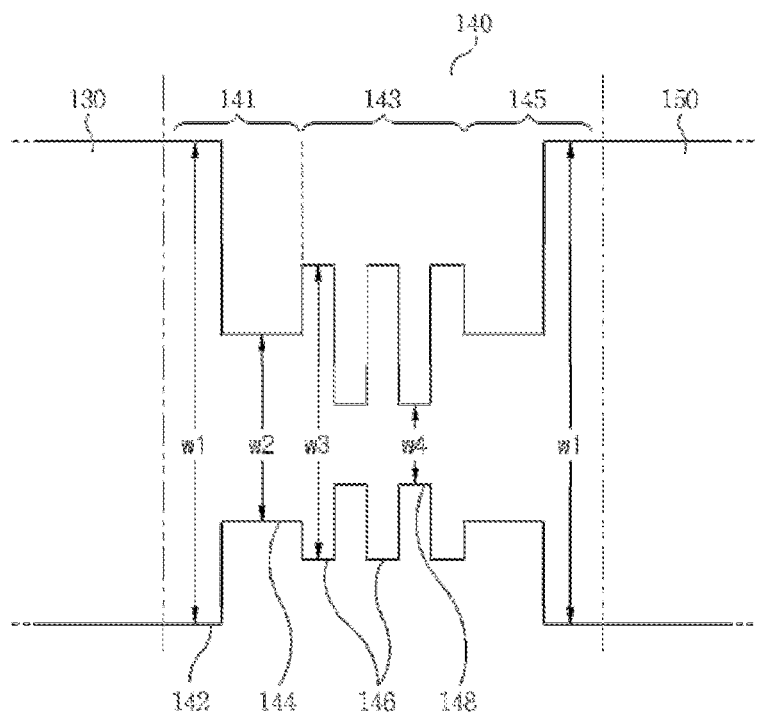
FIG. 4 is a diagram illustrating an energy band gap of a nitride based semiconductor light emitting device having an active layer with several interposed strain control layers in accordance with the second embodiment of the present invention.

Referring to FIG. 4, the nitride based semiconductor light emitting device in the second embodiment has a structure that the strain control layer 143 is formed as multiple layers in the active layer 140. In this case, a plurality of strain control layers 143 may be formed to have the same or different energy band gaps (w3, w4).

The maximum energy band gap (w3) of the plurality of strain control layers 143 is between that the energy band gap of a quantum barrier layer 142 and the energy band gap of a quantum well layer 144. The minimum energy band gap (w4) of the plurality of strain control layers 143 may be the same as or smaller than the energy band gap (w2) of the quantum well layer 144. Alternatively, the minimum energy band gap (w4) of the plurality of strain control layers 143 may be somewhat greater than the energy band gap (w2) of the quantum well layer 144. For example, the plurality of strain control layers 143 may have a structure that the first layer 146 having the energy band gap (w3) greater than the energy band gap (w2) of the quantum well layer 142 and the second layer 148 having the energy band gap (w4) smaller than that of the first layer 146 are disposed by turns.

As in the first embodiment, the nitride based semiconductor light emitting device in the second embodiment includes the strain control layer 143 having the plurality of first layers 146 having the energy band gap (w3) greater than the energy band gap (w2) of the quantum well layer 144 in the active layer 140, so that the luminous efficiency of the nitride based semiconductor light emitting device can be enhanced. Namely, by interposing the strain control layer 143 in the quantum well layer 144 of the active layer 140, a difference in latter constant between the quantum well layer 144 and the quantum barrier layer 142 is reduced. This results in an agreement on spatial distribution between a wave function of electrons and a wave function of holes, thereby increasing a recombination rate of electrons and holes which contribute to a light-emitting process.

While this invention has been particularly shown and described with reference to an exemplary embodiment thereof, it will be understood by those skilled in the art that various changes in form and details may be made therein without departing from the spirit and scope of the invention as defined by the appended claims.

What is claimed is:

1. A nitride based semiconductor light emitting device, comprising:
    an n-type nitride layer;
    an active layer formed on the n-type nitride layer;
    a p-type nitride layer formed on the active layer; and
    a strain control layer formed in the active layer and including at least one layer having an energy band gap greater than an energy band gap of a quantum well layer of the active layer,
    wherein each of the active layer and the strain control layer is formed of a material represented as $Al_xIn_yGa_{1-x-y}N$ ($0<x<1$, $0<y<1$),
    wherein, in the strain control layer, the aluminum content of a layer having an energy band gap greater than the energy band gap of the quantum well layer of the active layer is greater than the aluminum content of the quantum well layer of the active layer.

2. The nitride based semiconductor light emitting device of claim 1, wherein the strain control layer is interposed in the active layer at a region where the quantum well layer of the active layer is formed.

3. The nitride based semiconductor light emitting device of claim 2, wherein the energy band gap of the strain control layer is smaller than an energy band gap of a quantum barrier layer of the active layer.

4. The nitride based semiconductor light emitting device of claim 3, wherein the energy band gap of the strain control layer is formed as a plurality of layers in the active layer, and the plurality of layers has different energy band gaps.

5. The nitride based semiconductor light emitting device of claim 1, wherein, in the strain control layer, the aluminum content of the layer having the energy band gap greater than the energy band gap of the quantum well layer of the active layer is smaller than the aluminum content of a quantum barrier layer of the active layer.

* * * * *